United States Patent [19]

Gelsomini

[11] Patent Number: 4,729,118
[45] Date of Patent: Mar. 1, 1988

[54] ON-CHIP CONVERTER TO REVERSIBLY CHANGE MEMORY ORGANIZATION USING EXTERNAL SIGNALS

[75] Inventor: Tito Gelsomini, Reiti, Italy

[73] Assignee: Texas Instruments Incorporated, Dallas, Tex.

[21] Appl. No.: 837,631

[22] Filed: Mar. 10, 1986

[51] Int. Cl.⁴ .................................................. G11C 8/00
[52] U.S. Cl. ....................................... 365/230; 365/189
[58] Field of Search ................ 365/189, 230, 233, 240, 365/185

[56] References Cited

U.S. PATENT DOCUMENTS 4,044,339  8/1977  Berg ...................................... 365/240
4,646,265  2/1987  Takamizawa et al. .............. 365/104

Primary Examiner—Joseph A. Popek
Attorney, Agent, or Firm—John G. Graham; Rodney M. Anderson

[57] ABSTRACT

A device for changing the organization of an array of memory cells formed on a semiconductor ship using external control signals which includes a storage device for storing an external enable/disable command signal on the chip, a divider for dividing the array into blocks of memory cells in response to a stored enable command and a pass gate assembly for permitting access to selected ones of the blocks in response to corresponding toggle input signals when an enable command is stored.

7 Claims, 3 Drawing Figures

ON-CHIP CONVERTER TO REVERSIBLY CHANGE MEMORY ORGANIZATION USING EXTERNAL SIGNALS

BACKGROUND OF THE INVENTION

The present invention relates to a method for permitting a user to change memory organization of a semiconductor memory chip by using only external signals.

In utilizing arrays of EEPROMS users generally have available for purchase VLSI memory chips with a particular organization. For example, one can purchase either an array having its cells arranged in a 64 K×8 layout of a 128 K×4 layout. One can convert the former layout to the latter but only by purchasing additional hardware such that the cost of the hardware plus the cost of the 64 K×8 chip is greater than the cost of a 128 K×4 chip. Thus, a user can stock both 128 K×4 and 64 K×8 chips or the latter together with the hardware necessary to make the aforementioned conversion.

Accordingly, it is a principal object of the present invention to provide a device for converting on-chip from one type of memory organization to another simply by the use of external signals.

SUMMARY OF THE INVENTION

According to the invention there is provided a device for changing the organization of an array of memory cells formed on a semiconductor chip using external control signals which includes means for storing an external enable/disable command signal on the chip, means for dividing the array into blocks of memory cells in response to a stored enable command and means for permitting access to selected ones of the blocks in response to corresponding toggle input signals when an enable command is stored.

Preferably, the dividing means includes means for dividing input-output lines coupled to the array into sets of input/output lines corresponding to the blocks of memory cells.

Advantageously, the number of sets of input/output lines is 2.

The storing means may be an electrically erasable, programmable read only memory cell. The dividing means may be a logic circuit coupled to the array which when enabled permits accessing of selected ones of a plurality of blocks of the array in response to external toggle input signals.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 1:
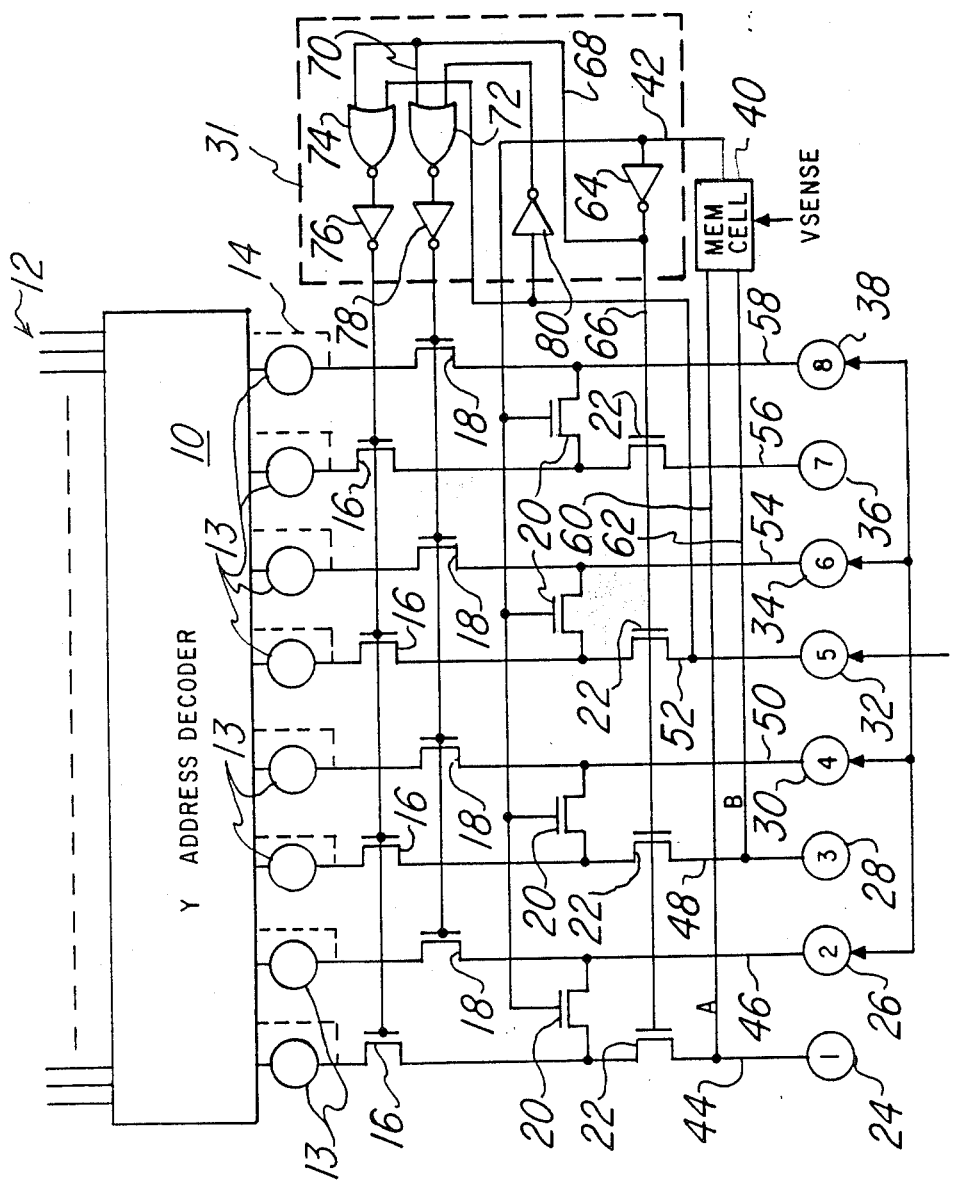
FIG. 1 is a circuit diagram of a preferred embodiment of the memory array organization converter.

With reference to FIG. 1, a circuit diagram of a memory array organization changer which would ordinarily be applied to an array of VLSI memory cells is shown for the case in which the transistors are N-channel devices. The array column lines 12 are coupled to a Y address decoder 10. The Y address decoder 10 has a 8 input/output lines 44, 46, 48, 50, 52, 54, 56, and 58. Each of the latter lines is coupled to the decoder 10 both through a sense amplifier 13 and directly by a line 14 (shown dotted). Each of the aforementioned lines is coupled to an input terminal 24, 26, 28, 30, 32, 34, 36, and 38, respectively. The input/output lines are divided into a first set in series with pass gates 16 and a second set in series with pass gates 18. Coupling each line of the first and second set of input/output lines are pass gates 20 connected between pass gates 16 and 18 and corresponding input terminals 24 to 38. Connected in series with each input/output line of the first set is a pass gate 22 coupled to the latter line between corresponding pass gate 20 and associated input terminal of terminals 24, 28, 34, and 38.

A non-volatile memory element, such as an electrically erasable programmable memory element 40 or an ultra violet erasable programmable memory element, has input lines 60 and 62 connected to input terminals 44 and 48, respectively, and an output 42 coupled to a logic circuit 31. Line 42 also goes directly to the gates of pass gates 20 and after being inverted by inverter 64 is also coupled by line 66 to the gates of pass gates 22. The output of inverter 64 is coupled by line 68 to NOR circuits 72 and 74. The other inputs to NOR circuits 72 and 74 are provided by a toggle input to toggle terminal 32 which goes directly into NOR circuit 74 and after passing through an inverter 80 goes into another input to inverter 72. The outputs of inverters 72 and 74 are fed into inverters 76 and 78 before connecting to the gates of pass gates 16 and 18, respectively.

Figure 2:
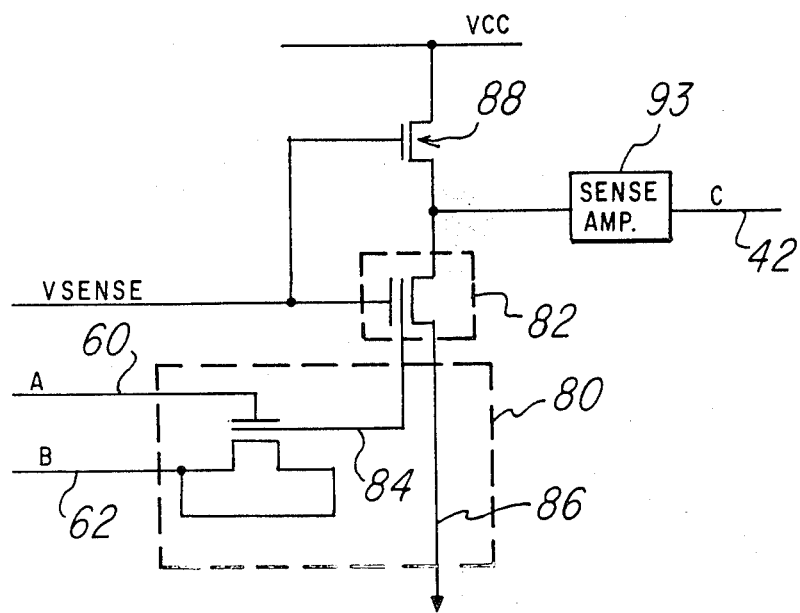
FIG. 2 is a schematic diagram of a electrically erasable programmable read only memory element.

The construction of the memory element 40 is shown in detail in FIG. 2 and consists of a floating gate transistor 82 whose floating gate 84 is connected to the floating gate of a tunnel device 80. The latter device has two inputs A and B on line 60 and 62, respectively. A load transistor 88 is coupled between the source of the floating gate transistor 82 and Vcc while the drain is connected by line 86 to ground. A sense amplifier 93 is coupled between the source of floating gate transistor 82 and output line 42.

In operation a +16 volt signal applied to line 60 relative to line 62 causes the floating gate 84 to become charged negatively with electrons. This means that with about a +2 volt Vsense signal applied, floating gate transistor 82 will be non-conducting and the output voltage on line 42 will be high. If, however, a −16 volt signal is applied to line 60 relative to line 62, then the floating gate 84 will be charged positively and will be on when Vsense is applied. In the latter case the output on line 42 will be low.

In the configuration of FIG. 1, with the output on line 42 high, logic circuit 31 becomes enabled in that one input to each of NOR gates 72 and 74 are low. Thus, a logic 1 signal on toggle input terminal 32 will result in the first set of pass gates 16 turning on and the second set 18 turning off; conversely, a logic 0 on terminal 32 will result in the first set of pass gates 16 turning off and the second set 18 turning on. For both of the above conditions pass gates 20 are turned on while pass gates 22 are turned off.

If memory cell 40 is programmed in the reverse so that the output on line 42 is low then an input of each of NOR gates 72 and 74 will be high forcing pass gates 16 and 18 on. At the same time pass gates 22 are turned on while pass gates 20 are turned off. The disabled condition is thus the normal ×8 configuration of the memory cells in this case.

In the enabled condition with the output 42 of EEPROM cell 40 high the turning on of pass gates 16 and 18 to utilize the first and second set of input/output lines can be alternated or toggled by simply raising and lowering the signal on terminal 32. This feature enables the user to treat the array as two ×4 blocks rather than one ×8 block.

Clearly, this method is applicable to different sizes of arrays and can change the organization in any way desired such as, for example, from a ×8 to a ×5 block and ×3 block simply by rearranging the pass gates. The latter reorganization would simply involve another gate 16 in say line 58, removal of pass gate 18 from line 58 as well as pass gates 20 and 22. It is also clear that any number of bits such as say 16 bits can easily be incorporated into this method.

Figure 3:
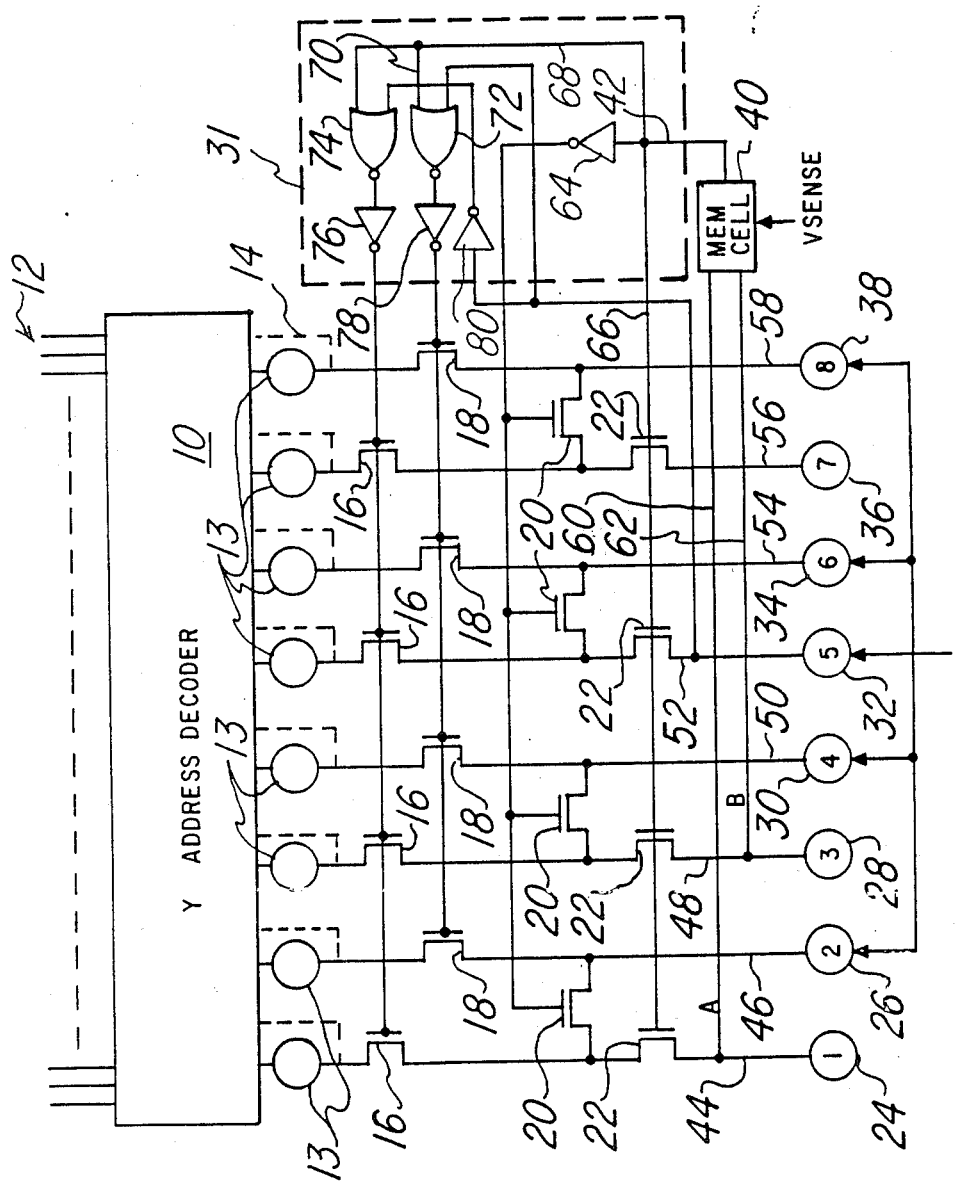
FIG. 3 is a circuit diagram of a variant of the embodiment of FIG. 1.

A variant of the circuit of FIG. 1 is shown in FIG. 3 which simply reverses the role of the high and low outputs of memory cell 40 in which lines 66 and 68 are taken directly from output 42, and the line to gates of pass gates 20 is taken from the output of inverter 64. Inverter 80 is shown as applied to the input of NOR circuit 74 but could optionally be applied as in FIG. 1 to NOR circuit 72. Otherwise the operation of the circuit is the same as that of FIG. 1.

It will also be appreciated that a memory array may be divided up into more than two blocks by the present invention with switching done from one such block to the other by simply incorporating additional OR circuits (a NOR circuit followed by an inverter is an OR circuit) to drive the additional corresponding input/output sets of series pass gates equivalent to pass gates 16 and 18.

It is apparent that P-channel transistors could be used in place of the N-channel transistors shown except that the associated logic must change to accomodate the required gate signal reversal.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. In a semiconductor memory device having a first output line and a second output line for communication of data therefrom, a circuit for selectively connecting, responsive to an external control signal, either said first or said second output line, or both, to first and second external terminals of said device, respectively, said circuit comprising:

means for storing the logic state of an external enable/disable command signal;

means, connected between said first output line and said first external terminal, for disconnecting said first output line from said first external terminal responsive to said stored command signal being at a first logic state and for connecting said first output line thereto responsive to said stored command signal being at a second logic state; and toggle means for selectively connecting either said first or said second output line to said second output terminal in response to a toggle input signal said toggle means enabled when said first logic state is stored by said storing means, and disabled when said second logic state is stored by said storing means.

2. A circuit according to claim 1, wherein said storing means is an electrically erasable, programmable read only memory cell.

3. A circuit for providing a selectable number of data outputs, comprising:

a programmable memory element programmable into a first and a second logic state;

first and second output lines;

first and second output terminals corresponding to said first and second output lines;

first and second pass gates coupled to said output lines for controlling conduction therealong;

a third pass gate, connected between said first output line and said first output terminal;

a fourth pass gate, connected between said first output line and said second output terminal; and a logic circuit having outputs coupled to said pass gates, having an input coupled to said memory element, and having an input receiving a toggle input signal, such that with said memory element in said first logic state, said logic circuit is enabled to control said third pass gate to disconnect said first output line from said first output terminal, to control said fourth pass gate to connect said first output line to said second output terminal, and to enable either said first or said second pass gate in response to said toggle input signal, thereby selecting whether said first output line or said second output line is connected to said second output terminal, and such that with said memory element in said second logic state, said logic circuit enables both said first and second pass gates, enables said third pass gate and disables said fourth pass gate, so that said first and second output lines are connected to said first and second output terminals, respectively.

4. A circuit according to claim 3, wherein said programmable memory element is an electrically programmable, erasable, read only memory cell.

5. A circuit according to claim 3, wherein said logic circuit includes a first OR gate coupled to said first pass gate and a second OR gate coupled to said second pass gate, said first and second OR gates each having a first input coupled to said memory element, and having a second input coupled to said toggle terminal in such a manner that the logic state of the second inputs of said first and second OR gates are the logical complement of one another.

6. A circuit according to claim 5, wherein said toggle input signal is received by said first output terminal during such time as said memory element is in said first logic state.

7. A circuit according to claim 3, wherein said toggle input signal is received by said first output terminal during such time as said memory element is in said first logic state.

* * * * *